(12) United States Patent
Akram

(10) Patent No.: US 7,129,114 B2
(45) Date of Patent: Oct. 31, 2006

(54) METHODS RELATING TO SINGULATING SEMICONDUCTOR WAFERS AND WAFER SCALE ASSEMBLIES

(75) Inventor: Salman Akram, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 21 days.

(21) Appl. No.: 10/797,504

(22) Filed: Mar. 10, 2004

(65) Prior Publication Data

US 2005/0202651 A1 Sep. 15, 2005

(51) Int. Cl.
*H01L 21/44* (2006.01)
*H01L 21/46* (2006.01)

(52) U.S. Cl. ............. 438/110; 438/113; 438/458; 438/459; 438/460

(58) Field of Classification Search ............ 438/110, 438/113, 458, 459, 460, 462
See application file for complete search history.

(56) References Cited

U.S. PATENT DOCUMENTS

| | | | |
|---|---|---|---|
| 4,729,971 A | 3/1988 | Coleman | |
| 5,185,295 A | 2/1993 | Goto et al. | |
| 5,851,928 A | 12/1998 | Cripe et al. | |
| 5,923,995 A | 7/1999 | Kao et al. | |
| 5,998,234 A | 12/1999 | Murata et al. | |
| 6,117,347 A | 9/2000 | Ishida | |
| 6,136,668 A | 10/2000 | Tamaki et al. | |
| 6,271,102 B1 | 8/2001 | Brouillette et al. | |
| 6,399,463 B1 * | 6/2002 | Glenn et al. | 438/463 |
| 6,420,245 B1 * | 7/2002 | Manor | 438/460 |
| 6,444,499 B1 * | 9/2002 | Swiss et al. | 438/127 |
| 2005/0082651 A1 * | 4/2005 | Farnworth et al. | 257/678 |

* cited by examiner

Primary Examiner—Hsien-Ming Lee
(74) Attorney, Agent, or Firm—TraskBritt

(57) ABSTRACT

Methods relating to the singulation of dice from semiconductor wafers. Trenches or channels are formed in the bottom surface of a semiconductor wafer, corresponding in location to the wafer streets. The trenches may be formed by etching or through an initial laser cut. The wafer is then singulated along the streets with a laser preferably having a beam narrower than the trenches. Multiple, laterally spaced lasers may be used in combination during a single pass to perform simultaneous singulating cuts. Additional edge protection for integrated circuitry on the active surface of the semiconductor dice may be provided by forming trenches or channels along the streets in the active surface instead of the bottom surface, disposing protective material along the streets and within the trenches prior to singulation and cutting through the wafer, leaving protective material on the sidewalls of the channels.

32 Claims, 6 Drawing Sheets

METHODS RELATING TO SINGULATING SEMICONDUCTOR WAFERS AND WAFER SCALE ASSEMBLIES

BACKGROUND OF THE INVENTION

1. Field of the Invention

The present invention relates to methods and apparatus for cutting semiconductor wafers and wafer scale assemblies for singulation into dice or groups of die locations. More particularly, but not limited thereto, the present invention relates to the singulating of semiconductor wafers and wafer scale assemblies using laser cutting, alone or in combination with other techniques, to enable a reduction in the required width of streets between semiconductor die locations.

2. State of the Art

Singulating semiconductor wafers, also known as dicing or die separation, is the process of cutting a semiconductor substrate having integrated circuits formed thereon into individual semiconductor dice. Currently, although a number of methods for singulating semiconductor wafers are known, the most commonly used methods involve cutting the wafer along scribe or severance lines (commonly termed "streets") with a rotating circular abrasive saw blade.

Dicing with a rotating blade is a mechanical process of machining with abrasive particles to remove material from selected areas of the wafer. Dicing saw blades are typically made in the form of an annular disc that is either clamped between the flanges of a hub or built on a hub that accurately positions the thin flexible saw blade, which carries diamond particles as the abrasive material. These saw blades are extremely thin (typically from 0.6 to 50 mils in thickness), flexible, rotate at high speed and are, therefore, susceptible to damage from binding due to deviations in the cutting path during singulation, leading to complete blade failure and usually substantial damage to the wafer being singulated.

Semiconductor wafers are coated with various layers in the course of fabricating integrated circuitry thereon at die locations, such coatings including passivating oxides or nitrides, polymer coatings, aluminum and a wide variety of other metals, in recent years including copper. Wafer streets may include at least some of these coatings as alignment markers. Further, test elements for use in probe testing of wafers may be placed in the areas within the streets to conserve wafer space (or "real estate") and enable more semiconductor dice to be formed on each semiconductor wafer for a given wafer size. Wafer streets are usually fully or partially coated with different materials and are largely nonhomogenous. The combination of materials in the streets, combined with the hardness of the underlying semiconductor material of the wafer substrate (typically crystalline silicon, although other materials such as germanium, gallium arsenide and indium phosphide are also employed), has a significant effect on the wafer singulation process and affects resulting die edge quality. In conventional dicing using a wafer saw, the die surfaces at the bottom or "back" side of the wafer can suffer severe bottom-side chipping. On the top or "active" surfaces of the dice on which the integrated circuitry is fabricated, conventional dicing can lead to cracking of the material layers, smearing and tearing of metallic pads, formation of polymer slivers, and shredding and tearing of the semiconductor material of the wafer substrate. For this reason the streets must be of sufficient width to allow any such anticipated damage occurring during dicing to remain clear of the functional integrated circuit elements of the dice, consequently reducing the real estate available for forming semiconductor dice on the wafer.

Attempts have been made to minimize the damage occurring during dicing. For example, lasers have been used to singulate wafers, although the heat generated by a laser cutting through a thick wafer can thermally stress and damage both the semiconductor material of the resulting semiconductor dice and integrated circuit components thereof. Lasers may also produce slag from melted material lying along cut edges that may contaminate the semiconductor dice. Conventional laser cutting, like conventional wafer sawing, thus similarly requires streets to be of sufficient width to allow any damage occurring during dicing to be confined to areas of the semiconductor dice clear of the integrated circuit elements thereof, again reducing the real estate available for forming dice on the wafer.

Another attempt to minimize dicing damage is to make a partial cut through the wafer with a beveled saw blade, followed by a second cut passing through the wafer within the partial cut with a narrower saw blade. While such a technique reduces the incidence of bottom or back side chipping by reducing the width of material made by the final cut, it fails to remedy the other problems associated with abrasive cutting and may even require wider streets for the beveled blade. U.S. Pat. No. 6,420,245 to Manor, the entire disclosure of which is incorporated herein by of the top surface with a laser to form scribe lines prior to cutting with an abrasive rotating blade. This technique, however, requires the use of both a laser and a mechanical saw, potentially exposing the singulated semiconductor dice to damage associated with both of these techniques and requiring streets wide enough to absorb such damage.

An alternative method of dicing is disclosed in U.S. Pat. No. 136,668 to Tamaki et al. Using this technique, a metal layer, in the form of a grid extending over the streets, is formed over an active surface of a silicon wafer. The silicon wafer body is singulated, but for the presence of the metal layer, by etching therethrough (after back grinding to reduce the wafer thickness) from the back side to the metal layer. The dice are then separated by melting and fusing the metal layer along the streets using a laser. Since this method involves etching through the entire thickness of the wafer and requires the presence of the metal layer as well as enough separation from the integrated circuitry of each semiconductor die to avoid damage from the laser-fused metal, the required width of the streets remains significant. This method also requires the extra steps to form the metal layer.

Accordingly, an approach to singulation of a semiconductor wafer which enables the use of smaller street widths would be an improvement in the art. Similarly, such an approach additionally offering the capability of producing semiconductor dice with protected edges at the perimeter of the active surface would also be an improvement in the art.

BRIEF SUMMARY OF THE INVENTION

The present invention, in one embodiment, is directed to methods relating to the singulation of semiconductor wafers. In this embodiment, a plurality of trenches is formed in the back side of a semiconductor wafer, in a pattern corresponding to and aligned with a pattern of streets between semiconductor die locations on the active surface. The trenches pass through a portion of the wafer material, reducing the thickness of the wafer to be cut during singulation. The trenches may be formed by etching or through an initial laser cut made in the back side.

The wafer is then singulated along the streets from the active surface side thereof with a laser beam, which may be of lesser width than the trenches. Potential damage to the resulting dice may be limited by using a narrower laser beam to cut through the reduced thickness of the wafer along the trenches, lessening the potential for thermal stress due to a reduction in the time and energy required for singulation and increasing the distance from the integrated circuitry on the active surface near the periphery of the semiconductor dice. The required width of the streets on the active surface of the wafer may thus be reduced, making additional wafer area available for semiconductor die fabrication.

In another embodiment, the present invention comprises providing additional edge protection at the perimeters of the active surfaces of the semiconductor dice by forming channels, or trenches, along the streets from the active surface of the wafer, filling the channels or trenches with a protective material such as a dielectric, and then singulating the semiconductor dice using a laser beam of lesser width than the trenches and directed along paths substantially centered within the trenches, leaving a coating of the protective material along sidewalls of the channels or trenches at the perimeter of the active surfaces of the semiconductor dice.

In still another embodiment, the present invention comprises the use of a plurality of laterally separated lasers traversed in tandem in a single pass across a wafer to perform simultaneous cuts into the semiconductor wafer.

In yet another embodiment, the present invention comprises a method for singulating a wafer scale assembly comprising a semiconductor wafer and an aligned, superimposed wafer scale glass substrate into individual assemblies each comprising one or more semiconductor dice and a glass segment overlying the active surface of same. Such an arrangement is contemplated for implementation, by way of example only, in CMOS imagers.

In a further embodiment, the present invention comprises a method for singulating a wafer scale assembly comprising two aligned, superimposed wafers, one of which may comprise, for example, a flip chip configured semiconductor die wafer and the other of which may comprise, for example, a blank semiconductor or other substrate of similar coefficient of thermal expansion (CTE) configured with conductive vias extending between terminal pads on one side aligned with conductive bumps of the flip chip dice on the one semiconductor wafer and rerouted external contact locations on the other side and bearing conductive bumps for connection to higher level packaging.

BRIEF DESCRIPTION OF THE SEVERAL VIEWS OF THE DRAWINGS

In the drawings which, in conjunction with the text herein, enable the present invention and include the best mode presently known or contemplated for the practice thereof.

DETAILED DESCRIPTION OF THE INVENTION

As used herein, the term "wafer" is not limited to conventional wafers of silicon or other semiconductor materials but also includes bulk substrates including a layer of semiconductor material carried by a supporting structure including, without limitation, silicon on insulator (SOI) substrates as exemplified by silicon on glass (SOG) and silicon on sapphire (SOS) substrates, as well as other structures known to those of ordinary skill in the art. Further, the terms "active surface" and "top surface" may be used interchangeably herein to designate a surface of a wafer having integrated circuitry fabricated thereon, while the terms "back side," "back surface," and "bottom surface" may be used interchangeably herein to designate a surface of a wafer opposite that on which integrated circuitry is fabricated. Hence, the use of directional terminology is for convenience and to facilitate understanding of the present invention and the practice thereof, and not by way of limitation, as a wafer may be positioned, retained, or held at any desired or appropriate angle to facilitate processing in accordance with the present invention.

Figure 1:
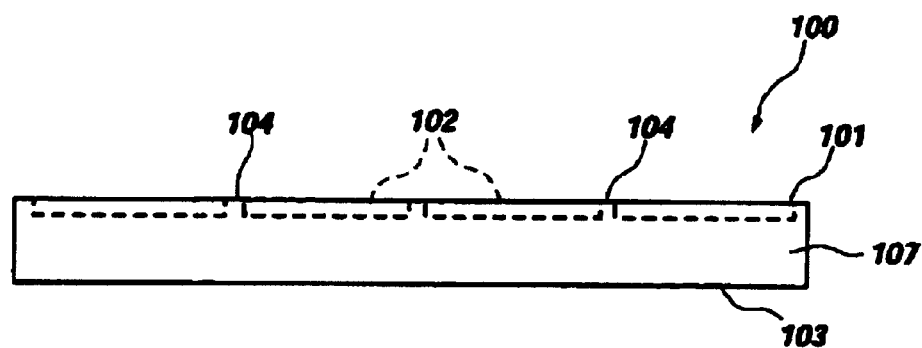
FIG. 1 is a side view of an exemplary structure of a semiconductor wafer for singulation in accordance with the present invention.

FIG. 1 depicts a semiconductor wafer 100 including active areas 102 and intervening streets 104 located adjacent the active or top surface 101. Streets 104 are arranged in a grid pattern (see FIG. 7) on semiconductor wafer 100 and cutting through the semiconductor wafer 100 therealong will result in the severance or singulation of individual semiconductor dice or groups of contiguous dice from semiconductor wafer 100. The body 107 of semiconductor wafer 100 may be formed from any semiconductor material known to those of ordinary skill in the art, as previously noted, and the present invention is not limited by any particular semiconductor material, or material of a supporting structure, in the case of SOI structures. Following conventional processing to form active areas 102 and define streets 104, a semiconductor wafer 100 may be relatively thick. For example, semiconductor wafer 100 may be from about 700 to about 850 μm, or more, in thickness. In the instance of SOI structures, the semiconductor layer may be thinner, but the entire bulk substrate structure will be of substantial thickness so as to be sufficiently robust to withstand handling and processing.

Figure 2:
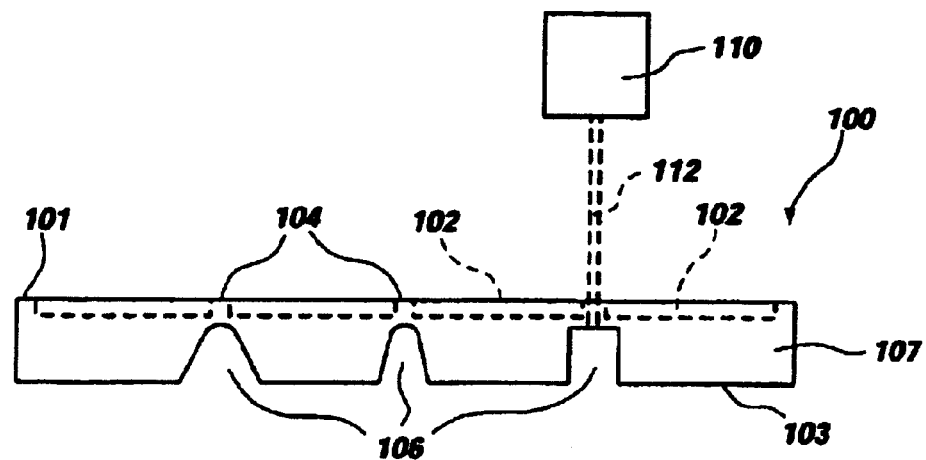
FIG. 2 is a side view of the semiconductor wafer of FIG. 1, in the process of being singulated in accordance with one embodiment of the present invention.

As shown in FIG. 2, the semiconductor wafer 100 is thinned along singulation paths by the formation of one or more trenches 106 in the bottom surface or back side 103 of semiconductor wafer 100 underneath the streets 104. Trenches 106 may be formed by any suitable method known, now or in the future, to those of ordinary skill in the art, and the cross-sectional appearance of a trench 106 will be determined by the formation method selected. For example, the trenches 106 may be formed by wet etching or dry etching and may be anisotropically etched, or isotropically etched as is desired or required for the particular substrate material or reaction conditions. For example, a wet anisotropic etch may be performed on a silicon substrate by using a potassium hydroxide (KOH) or a tetramethyl ammonium Hydroxide (TMAH) solution at a temperature of about 80° C. to form a trench 106 with relatively steeply sloped sidewalls as shown in center trench 106 of FIG. 2. Alternatively, a dry anisotropic etch may be performed such as a reactive ion etch, plasma etch or ion beam etch (sputter etch), resulting in a trench 106 with substantially vertical sidewalls as shown in the right-hand trench of FIG. 2, or a wet isotropic etch may be performed, for example with a mixture of $HNO_3$ and HF, buffered with $CH_3COOH$, to remove wafer material at substantially the same rate in all directions and resulting in a trench 106 having sidewalls of lesser inclination, as shown in the left-hand trench of FIG. 2. As known in the art, the known crystallographic orientation of the wafer, in combination with the etch formula selected, may be employed to achieve the desired trench cross-sectional shape. Trenches 106 may also be formed by mechanical methods, such as by using a wafer saw set to only partially cut through the thickness of semiconductor wafer 100.

When trenches 106 are formed by etching, any conventional process steps used to perform the etching, such as disposing a mask material on the back side or bottom surface 103 of the semiconductor wafer 100 followed by photo patterning thereof, applying an etchant and, optionally, a stop and maintaining the etching conditions, including without limitation temperature, are encompassed by and within the scope of the present invention. Prior to the formation of the trenches 106, the thickness of the semiconductor wafer 100 may be reduced, for example, to about 100 to about 200 μm to shorten the etch time required to form the trenches 106. For example, the back side or bottom surface of semiconductor wafer 100 may be abrasively or chemically abrasively background, chemically mechanically polished (CMP), or chemically etched back, as known to those of ordinary skill in the art.

Figure 3:
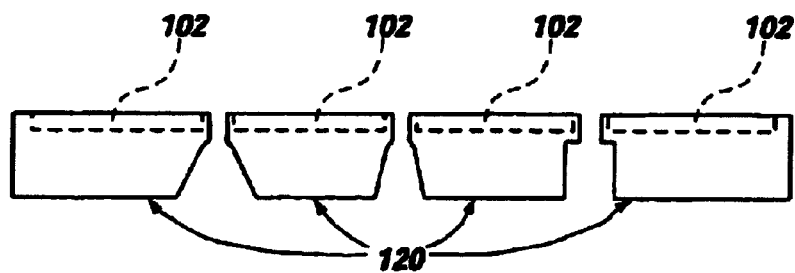
FIG. 3 is a side view of a plurality of semiconductor dice resulting from the singulation process depicted in FIG. 2.

Once formation of trenches 106 is complete, the semiconductor wafer 100 may then be singulated by laser cutting a finish cut along the streets 104, as shown in FIG. 2 by laser 110 emitting laser beam 112, coincident with the paths of previously formed trenches 106. The finish cut may be made from either the active surface 101 or the bottom surface 103 of the semiconductor wafer 100, although cutting from the active surface is currently preferred for superior alignment, and passes through the remainder of the body 107 of the semiconductor wafer 100. Following singulation, a plurality of semiconductor dice 120 (as shown in FIG. 3) is severed from the semiconductor wafer 100. Since the finish cut severs only a small thickness of the semiconductor wafer 100 remaining under trenches 106, the power and time required to make the cut is reduced, as is the heating of wafer body 107 by the laser beam 112, in comparison to cutting through the entire thickness of an entire semiconductor wafer 100, even when backgrinding or etch back has been performed. Due to the lesser amount of material to be removed, requiring less energy, the amount of contaminating slag produced by the laser beam 112 making the finish cut is reduced in comparison to laser ablation of the entire thickness of semiconductor wafer 100. This, in turn, allows for a much smaller width for streets 104 to be used than in conventional singulation approaches. While streets 104 having a width of 80 μm or more are required for conventional singulation using rotary saw blades or laser techniques, the width of streets 104 of a semiconductor wafer 100 required for singulation in accordance with the present invention is greatly reduced. It is contemplated that streets 104 may even require a width of as little as about 1 μm when singulation is effected according to the present invention.

The thickness of the semiconductor wafer 100 to be severed by the laser 110 in the finish cut may be varied as is desired for the particular application. It is currently preferred that the remaining thickness of wafer body 107 at the bottom of trenches 106 be at least equivalent to the depth of the active circuitry formed in the active areas 102 of semiconductor wafer 100. This allows the formation of trenches 106 to take place with fairly high dimensional tolerances for trench location while reducing the risk that the integrity of integrated circuitry in the active areas 102 is compromised by trench 106 formation. Since the integrated circuitry typically only forms a small percentage of the thickness of semiconductor wafer 100, trenches 106 may be formed such that their depth penetrates the majority of the wafer 100 thickness. For example, a trench 106 may have a depth of about 60% to about 90% of the wafer 100 thickness, leaving only about 10% to about 40% of the wafer to be finish cut.

Any additional procedures or actions needed or desirable to include in the singulation process may be incorporated and used. For example, following trench formation, the wafer 100 may be mounted by its back side or bottom surface 103 to an adhesive-coated dicing tape or film (such as UV-sensitive tape) for handling during the finish cut and subsequent pick and place operation to remove each die or group of dice from the wafer. Further, where desired and appropriate for the intended use of the semiconductor dice 120 formed on wafer 100, external contact structures such as under bump metallization, redistribution layers and conductive bumps such as solder balls may be formed on the wafer 100 either following or prior to trench 106 formation. Where trenches 106 are formed by etching, it may be desirable to form contacts or bumps on the semiconductor wafer 100 following etching to retain the advantages of wafer-level processing, while avoiding inadvertent exposure of these structures to etchants or the requirement for protection of such structures during etching. Formation of conductive bumps in the form of solder balls or conductive columns or pillars of conductive or conductor-filled epoxy, metal or alloy studs or other connective structure may be conducted as known in the art on the entire wafer at one time, allowing the benefits associated with wafer-level batch processing to be maintained. The narrow width of the laser 110 used to make the finish cut through the body 107 of semiconductor wafer 100 then enables singulation to occur with a greatly reduced potential for damaging the external contact structures.

Figure 4:
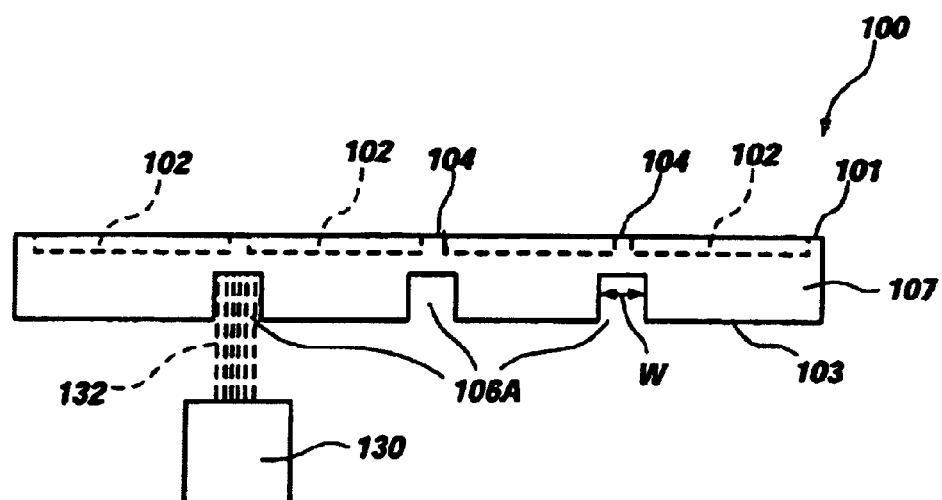
FIG. 4 and FIG. 5 are side views of the semiconductor wafer of FIG. 1, being singulated in accordance with another embodiment of the present invention.

Trenches 106 may also be formed by a first laser cut occurring on the back side or bottom surface 103 of the semiconductor wafer 100. One nonlimiting example of an embodiment of such a process, in accordance with the present invention, is depicted in FIG. 4. A semiconductor wafer 100 has active areas 102 and streets 104 disposed adjacent a top or active surface 101 thereof. Trenches 106A are formed in the bottom surface 103 by initial trenching cuts made by a laser beam 132 generated by lower laser 130. As with trenches 106, discussed previously herein, trenches 106A are formed in the back side or bottom surface 103, along paths coincident with streets 104 along which singulation is to be effected by the final cuts of the semiconductor wafer 100. A grid pattern of trenches 106A is thus formed, corresponding to the grid pattern of streets 104 on the active or top surface 101.

Trenches 106A maybe cut by laser ablation of the semiconductor material of wafer body 107 (again, following optional wafer thinning by backgrind or etch back) to a depth roughly equivalent to, but slightly less than, the depth the integrated circuitry of active areas 102 is formed in the wafer 100. Since the integrated circuitry typically only forms a small percentage of the thickness of semiconductor wafer 100, trenches 106A may be cut such that their depth penetrates the majority of the wafer 100 thickness. For example, a trench 106A may have a depth of about 60% to about 90% of the wafer 100 thickness, leaving only about 10% to about 40% of the wafer thickness to be finish cut. Of course, it will be appreciated that where appropriate, trenches 106A may be cut to other depths. For example, where fine focus, orientation and directional control of the lower laser 130 is possible, trench 106A may extend upwardly past the depth at which active areas 102 penetrate the wafer 100. However, in many instances the cost of such equipment and the time involved in effecting precision laser cuts renders the making of an initial, wider laser cut at a lower resolution more desirable.

Trench 106A has a width W formed by the laser beam 132 emitted by lower laser 132. Width W may be formed by the width of the laser beam 132, or by lateral movement of the laser beam 132 during trench formation, the former being currently preferred.

Figure 5:
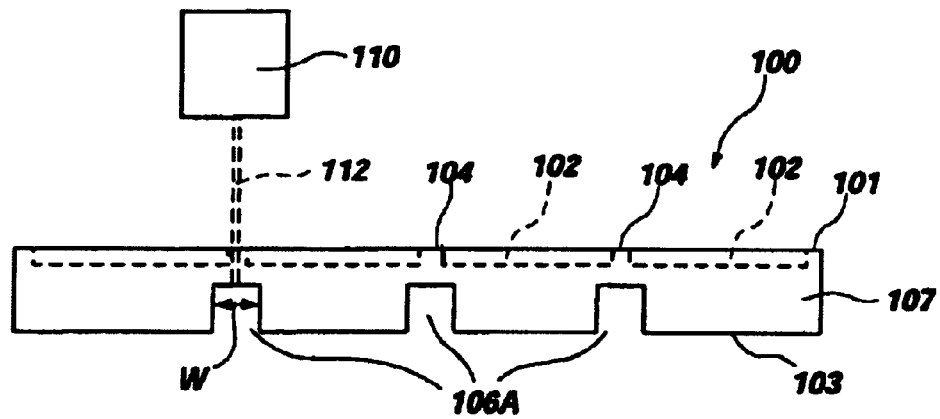
Figure 6:
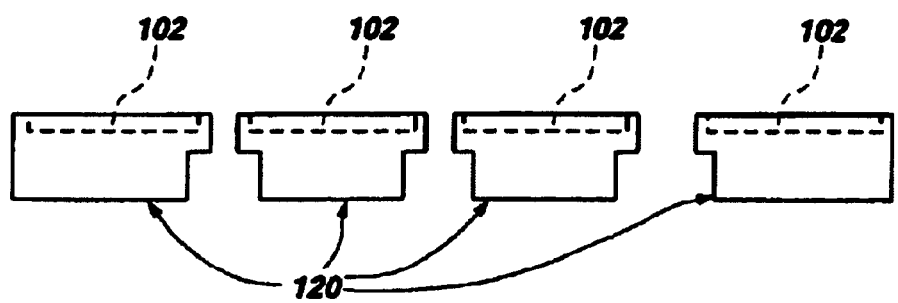
FIG. 6 is a side view of a plurality of semiconductor dice resulting from the embodiment of a singulation process depicted in FIGS. 4 and 5.

Turning to FIG. 5, singulation of the wafer 100 is accomplished by laser cutting a finish cut along the streets 104 using laser 110 generating laser beam 112. The finish cut may be made from either the top surface 101 or the bottom surface 103 into the body 107 of the wafer 100. Singulation severs a plurality of semiconductor dice 120 (as shown in FIG. 6) from the wafer 100. As the finish cut severs only a small thickness of the wafer body 107 along trenches 106A, the power required to make the cut is reduced, as is the heat generated in the semiconductor material of wafer body 107 by the laser, in comparison to cutting through an entire thickness of wafer 100. As noted previously, due to the lesser volume of wafer material to be ablated and the consequent ability to use less power, the amount of contaminating slag produced by the laser beam 112 making the finish cut is reduced, in comparison to singulating the entire thickness of wafer 100. The reduction in potential damage to the semiconductor material as well as reduced slag volume enables the use of a much narrower street 104 than with conventional singulation techniques. As discussed previously herein, while streets 104 having a width of 80 μm, or more, are usually required for standard singulation using a rotary saw blade or conventional laser techniques, the street 104 width of a wafer 100 is greatly reduced to as little as about 1 μm.

As shown in FIG. 5, the width W of trench 106A may be greater than the width of laser beam 112 and the cut effected thereby. Where the finish cut is accomplished through active or top surface 101, this improves control and alignment of the laser beam 112, particularly if machine vision is employed to track the paths of streets 104, and also remedies slight tolerance errors in beam width and path traversed that may occur in the singulation process. If the streets 104 of a wafer 100 are formed of slightly a different width or along slightly offset paths from the intended design, or if trenches 106A are slightly offset from the intended paths, the laser beam 112 will still fall within the width W of trench 106A. Slight variations in the wafer fabrication process are thus easily accounted for and accommodated.

Formation of trench 106A by cutting with lower laser 130 and singulation by finish cutting with a laser 110 may take place substantially concurrently in order to reduce the time taken by the singulation process. While lower laser 130 must form a portion of a trench 106A prior to the finish cut, laser beam 132 may be used to form trench 106A immediately in front or ahead of the path of the laser beam 112 of laser 110. For example, the lasers 130 and 110 may be traversed across the wafer 100 at the same time, with the upper laser 110 trailing the lower laser 130.

Figure 7:
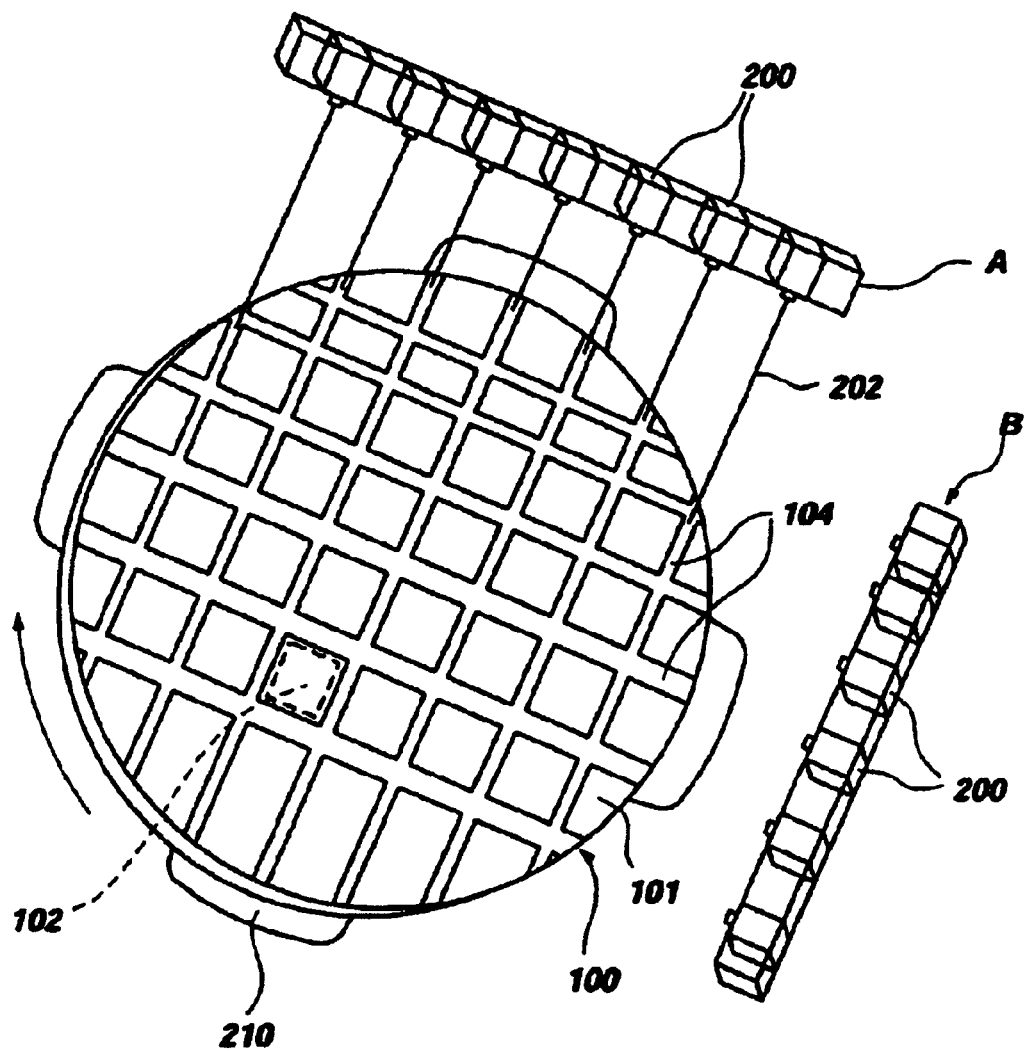
FIG. 7 is a perspective view of a semiconductor wafer being singulated using an apparatus of yet another embodiment of the present invention.

Although the embodiments discussed previously herein have referred to using a single laser to form the trenches and effect final singulation, it will be appreciated that a plurality of lasers 110, a plurality of lasers 130, or a plurality of both lasers 110 and 130 maybe used at the same time to practice the methods of the present invention. Turning to FIG. 7, one embodiment of the present invention using multiple, laterally spaced lasers is depicted. A first set A of lasers 200 (representative of either a plurality of lasers 110 or 130) are depicted above a wafer 100. Each of the lasers 200 emits a laser beam 202 that can be used to singulate the semiconductor wafer 100.

One possible arrangement for the first set of lasers A may be a bank of lasers comprising a plurality of lasers 200 fixed in a single row and spaced a predetermined distance apart, which distance, of course, may be adjusted for different die shapes and sizes. Where streets 104 of the wafer 100 are parallel, as is conventional, singulation may be accomplished by traversing the entire bank A of lasers 200 across a wafer 100 in a direction perpendicular to the row such that laser beams 202 thereof pass simultaneously through material of wafer body 107 along the streets 104. Where the streets form a conventional grid pattern across the semiconductor wafer 100, the bank A of lasers 200 may be traversed across the wafer 100 along a first directional path (multiple times with each pass over wafer 100 preceded by an appropriate offsetting of the ganged lasers 200 in a direction parallel to the row if fewer lasers 200 are present than parallel streets 104 on semiconductor wafer 100). Subsequently, when cuts have been made along all parallel streets 104, the semiconductor wafer 100 may be rotated 90° using wafer holder or chuck 210 about a vertical axis perpendicular to the plane thereof (or the bank of lasers 200 rotationally moved 90° to traverse a second directional path perpendicular to the first) and then traversed across the semiconductor wafer 100 to make a second series of cuts, perpendicular to the first series. Of course, it will be appreciated that the semiconductor wafer 100 may be moved or translated relative to the bank of lasers 200 instead. Where necessary, individual lasers 200 may be turned off or the laser beams 202 thereof may be redirected, to facilitate singulation.

Where a first group of lasers 200 are mounted as a single set, each laser 200 may be separately controlled and the laser beams 202 thereof individually laterally movable in directions perpendicular to that of the movement of the entire bank A (or of the wafer 100 relative to the laser bank). In such a fashion, adjustments to the paths of laser beams 202 to coincide with the paths of streets 104 may be effected as the lasers 200 move across the semiconductor wafer 100.

Where appropriate, a second set or bank of lasers B may be disposed, such that the laser beams generated thereby are traversed across semiconductor wafer 100 in a direction perpendicular to those of the first set. The second set of lasers B may then be used to provide the second pass to singulate the wafer 100. By providing multiple cuts in a single pass, the process of singulation is shortened. Optionally, backside gas cooling using, for example, helium (He) may be employed to prevent an increase in temperature of semiconductor wafer 100. The wafer may be placed on a conventional ceramic chuck or adhered on its back side to a wafer tape.

Turning to FIGS. 8–12, an exemplary embodiment is depicted of a method in accordance with the present invention to provide additional protection to the perimeter of an active surface of a semiconductor die during singulation from a semiconductor wafer, which method also facilitates the formation of under bump metallization and conductive bumps. For purposes of simplicity of illustration and to facilitate understanding of this embodiment, only a single under bump metallization structure and a single conductive bump is depicted at each semiconductor die location.

Figure 8:
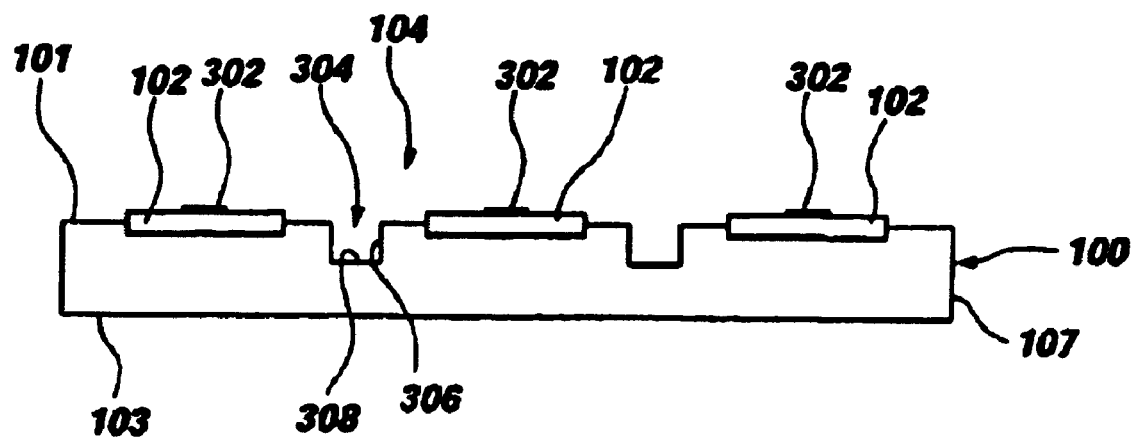
FIG. 8 is a side view of a semiconductor wafer having trenches formed in the active surface thereof in accordance with still another embodiment of the present invention.

As shown in FIG. 8, a semiconductor wafer 100 includes active areas 102 and may include external contact locations, such as those depicted by bond pads 302. Channels or trenches 304 are formed along the streets 104. Channels 304 are formed on the active or top surface 101 of the semiconductor wafer 100 and maybe formed in any suitable manner, as discussed previously herein with respect to forming trenches 106. Channels 304 may extend to any desired depth in the semiconductor wafer 100, and preferably past the depth of the active areas 102.

Figure 9:
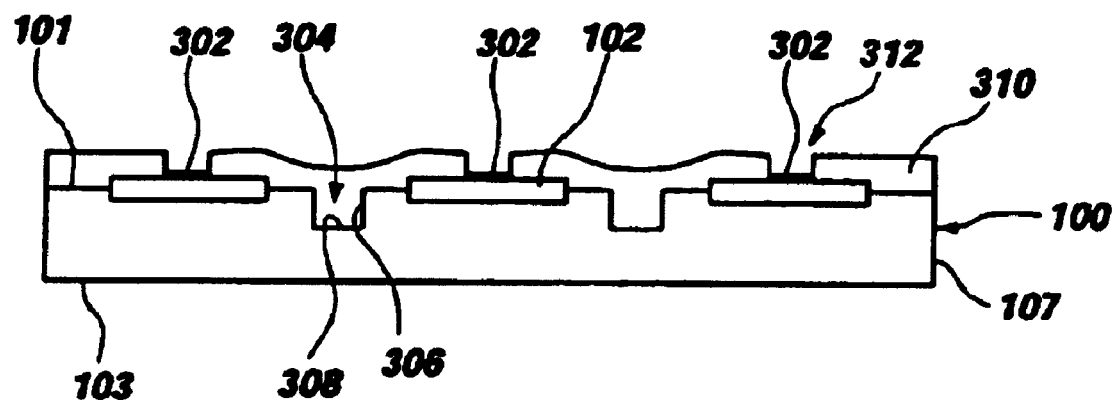
FIG. 9 is a side view of the semiconductor wafer of FIG. 8 having a passivating layer deposited thereon.
Figure 10:
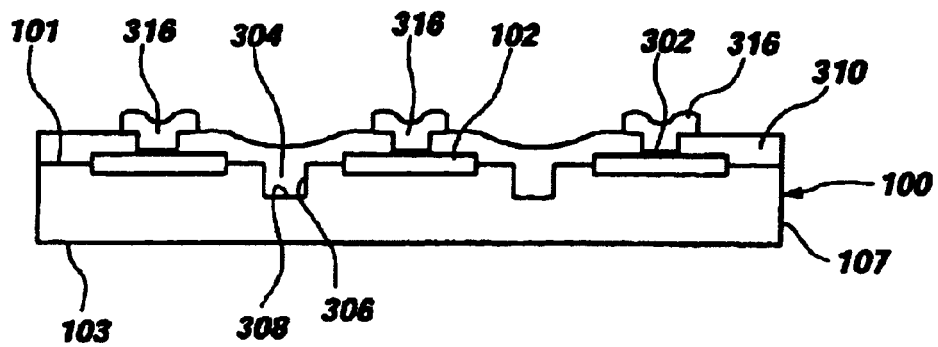
FIG. 10 is a side view of the semiconductor wafer of FIG. 9 with under bump metallization deposited thereon.
Figure 11:
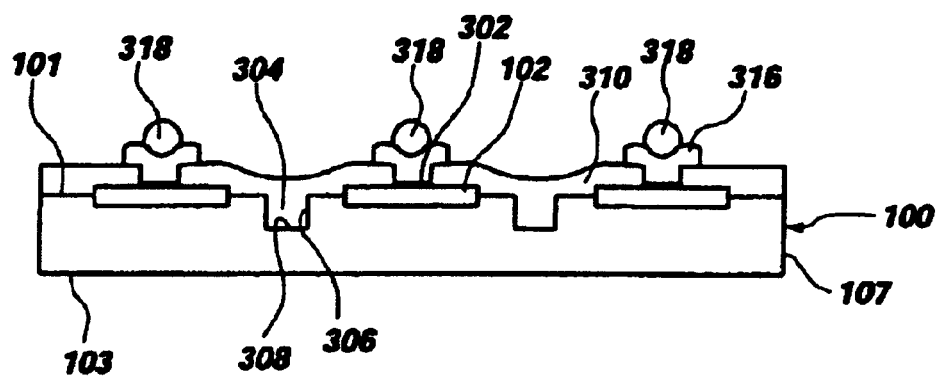
FIG. 11 is a side view of the semiconductor wafer of FIG. 10, with electrically conductive bumps formed over the surface thereof on the under bump metallization in the process of singulation.

As depicted in FIG. 9, a protective layer 310 is then deposited on the active surface of the semiconductor wafer 100. Protective layer 310 maybe formed from any suitable material for providing appropriate protection or passivation to the wafer 100, including dielectric materials such as polyimide materials, spin on glass (SOG) or photoimageable epoxies. The protective layer 310 extends into the channels 304 over the edges of the semiconductor die locations about the perimeter of the active surface 101 and substantially fills channels 304, covering the sidewalls 306 and bottom 308 thereof. Contact locations such as bond pads 302 (either as fabricated with the integrated circuitry or as relocated bond pads 302 of a redistribution layer) are typically present on the surface of the wafer 100, and openings 312 in the protective layer 310 may be provided to expose the contact locations. Deposition of the protective layer 310 may take place in any suitable manner, such as by stenciling, screening, spraying, spin coating, or any other suitable process. If spin coating or spraying is employed, it may be followed by masking and patterning a resist layer followed by etching to expose the contact locations (bond pads 302).

Where contact locations, such as bond pads 302, are accessible through the protective layer 310 as by openings 312 and a flip-chip configuration is desired for the semiconductor dice under fabrication, under bump metallization (UBM) structures 316 may be formed over the contact locations, as depicted in FIG. 10. UBM structures 316 may be formed by depositing a layer or layers of suitable conductive material on the contact locations to facilitate formation of conductive bumps such as solder balls thereon. For example and not by way of limitation, a copper layer followed by a nickel layer or a vanadium layer followed by a nickel layer may be used to enhance the metallurgical bond of a tin/lead solder ball to a bond pad 302. UBM structures 316 may be deposited in any suitable manner. For example, the metal layers may be electrolessly or electrodeposited from a solution, may be sputtered, or may be deposited by any other method known to those of ordinary skill in the art. Once the UBM structures 316 are formed (and masked and patterned, if required) discrete conductive elements in the form of a conductive bump, such as solder ball 318, may be formed thereon, as depicted by FIG. 11. Formation of conductive bumps may be accomplished in any suitable manner known to those of ordinary skill in the art. For example, masses of solder paste may be deposited as by stenciling or screen printing on the UBM structures 316 and heated to a molten state form solder balls 318. Alternatively, performed solder balls 318 may be applied and melted. Finally, metallic conductive bumps may be formed by plating and reflow techniques. Lead-free metallic compositions may also be employed to form conductive bumps. As another variation, other conductive bumps formed of a conductive or conductor-filled epoxy may be directly deposited on the bond pads 302, without the need for UBM structures 316.

Figure 12:
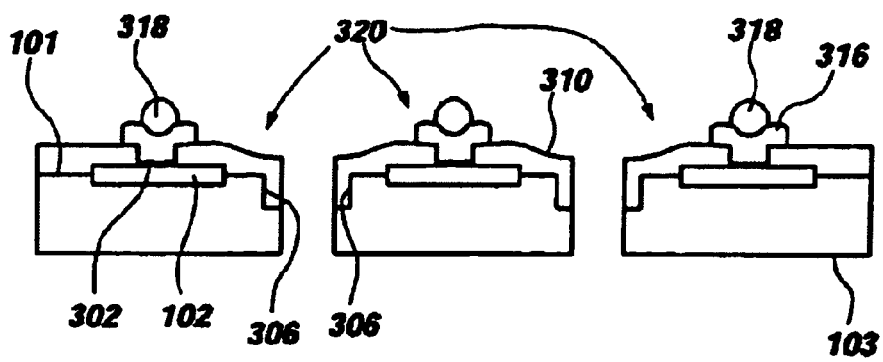
FIG. 12 is a side view of a plurality semiconductor dice formed from the wafer of FIG. 10 after singulation thereof.

Following bump formation, the wafer 100 is then singulated along the streets 104, as described previously herein. The finish cut is made using a laser 110 emitting a laser beam 112 of a lesser beam width than the width of channels 304 along the streets 104 and through protective layer 310 residing in channels 304. The cut may be made from either the active surface 101 or back side 103 of wafer 100 along a path substantially through the center of each channel 304 so that protective material on the sidewalls 306 of channels 304 flanks the laser beam 112. The resulting semiconductor dice 320, as depicted in FIG. 12, have the protective layer 310 extending over and around the edge of the semiconductor dice 320 as defined by the sidewalls 306 about the perimeter of the active surface 101 of each singulated semiconductor die 320. Any damage done by a laser beam 112 during the finish cut may thus be confined to the protective layer 310 in substantial isolation from the integrated circuitry of active areas 102 and the semiconductor material of wafer body 107.

As noted previously, the term "wafer" encompasses other bulk substrates on which semiconductor dice may be fabricated. Accordingly, the method and apparatus of the present invention may be applied to such other bulk substrates comprising a layer of semiconductor material on a supporting structure, wherein the supporting structure of glass, sapphire, etc., as well as a portion of the semiconductor layer may be etched or laser-cut prior to final singulation of semiconductor dice by a laser cut through the remaining thickness of the semiconductor layer.

The present invention further encompasses singulation of wafer scale assemblies.

Figure 13A:
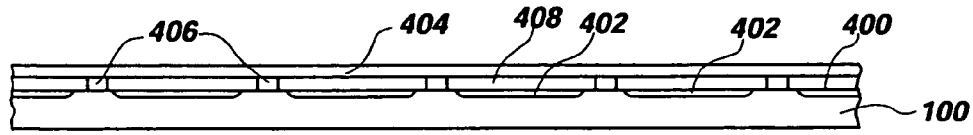
FIGS. 13A through 13C comprise schematic views of a process sequence for singulating a wafer scale assembly comprising a semiconductor wafer having an aligned, wafer scale glass substrate superimposed thereon into a plurality of individual assemblies.
Figure 13B:
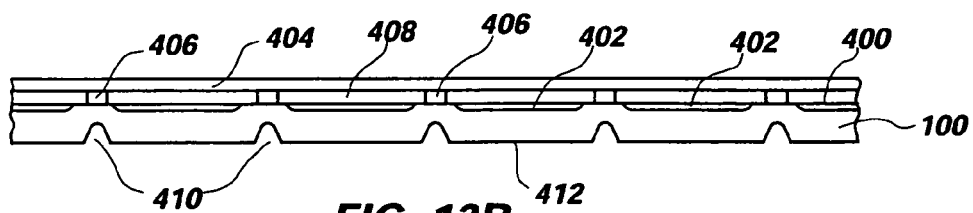
Figure 13C:
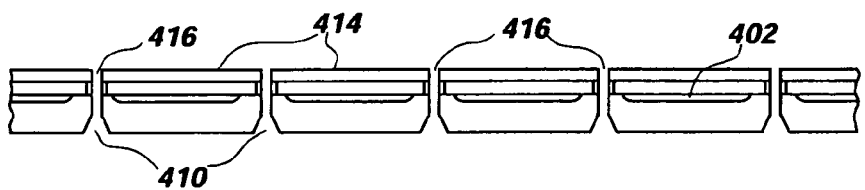

In one exemplary embodiment depicted schematically in FIGS. 13A through 13C, a wafer scale assembly comprises a semiconductor wafer 100 having a plurality of active devices 402 in the form of semiconductor dice fabricated on the active surface 400 thereof. In this example and as shown in FIG. 13A, active devices 402 comprise photoimagers such as CMOS imagers. A wafer scale glass substrate 404 is placed over semiconductor wafer 100 and adhered over active surface 400 using epoxy or polymer standoffs in the form of walls 406 bounding the location of each active device 402 and providing a space 408 between active devices 402 and the overlying wafer scale glass substrate 404. Next, and as shown in FIG. 13B, the semiconductor wafer 100 is partially etched through in alignment with standoff walls 406 as shown at 410 from the back side 412 thereof using one of the etching techniques and etchants previously described herein. Finally, and as shown in FIG. 13C, die scale or partial wafer scale assemblies 414 are singulated from the wafer scale assembly by laser ablating at 416 through the wafer scale glass substrate 404, through substantially the centers of standoff walls 406 and through the remaining, unetched thickness of semiconductor wafer 100. Of course, conductive traces (not shown for clarity) extend from each active device to a location on the exterior of the die scale or partial wafer scale assembly for connection to higher level packaging, as known in the art.

Figure 14A:
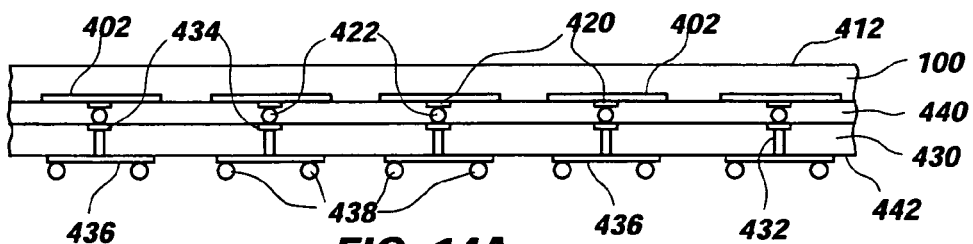
FIGS. 14A through 14C comprise schematic views of a process sequence according to the present invention for singulating a wafer scale assembly comprising a semiconductor wafer and another wafer scale substrate, which may comprise another semiconductor wafer or a substrate of another material of similar CTE.
Figure 14B:
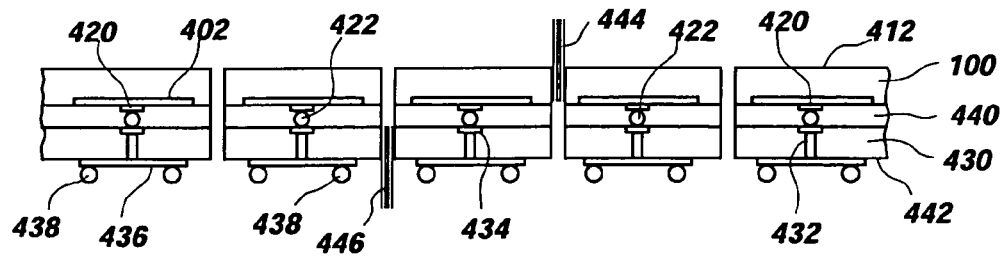
Figure 14C:
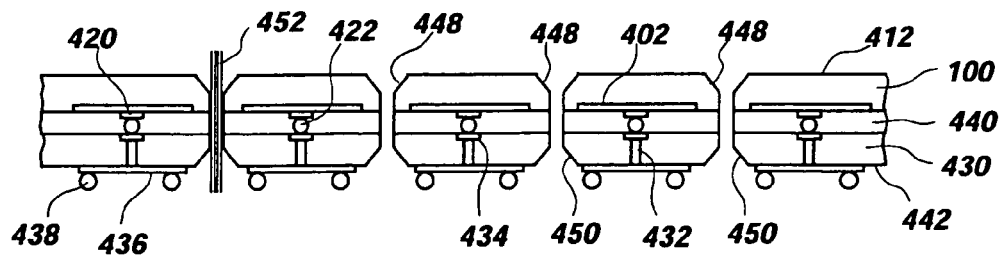

In another exemplary embodiment depicted schematically in FIGS. 14A through 14C, a wafer scale assembly comprises a first semiconductor wafer 100 having a plurality of active devices 402 in the form of semiconductor dice fabricated on the active surface 400 thereof. As shown in FIG. 14A, active devices 402 may comprise memory devices each having a central row of bond pads 420, each bond pad having a conductive bump 422 of solder, conductive epoxy or conductor-filled epoxy disposed thereon. A second wafer 430 of semiconductor material or another material, such as a ceramic, having a similar CTE to that of first semiconductor wafer 100, has been fabricated with a plurality of conductive vias 432 therethrough, each conductive via 432 terminating at one end thereof in a terminal pad 434 aligned with a conductive bump 422 of the first semiconductor wafer 100 and terminating at the other end thereof in, for example, a redistribution trace 436 of a redistribution layer, the redistribution traces 436 extending to terminal locations where conductive bumps 438 are disposed thereon. A dielectric underfill material 440 is disposed between first semiconductor wafer 100 and second wafer 430. As depicted in FIG. 14B, the wafer scale assembly may be singulated into die scale or partial wafer scale assemblies along boundaries between at least some of the die locations, each die scale or partial wafer scale assembly comprising a segment of first semiconductor wafer 100 and second wafer 430, by laser ablation as shown at 444 from the top (back side 412 of first semiconductor wafer 100) followed by inversion of the wafer scale assembly and laser ablation as shown at 446 from the bottom (exposed side 442 of second wafer 430), or vice versa, the laser ablation also cutting through dielectric underfill material 440. Alternatively, as shown in FIG. 14C, the semiconductor wafer 100 may be partially etched through from the back side 412 between die locations as shown at 448 and wafer 430 partially etched through from exposed side 442 as shown at 450 using one of the etching techniques and etchants previously described herein. Singulation is then completed from one side of the wafer scale assembly using laser ablation as shown at 452 to cut through the remaining substrate thicknesses and dielectric underfill material 440.

It will be apparent to those of ordinary skill in the art that additions, deletions and modifications of the methods and apparatus of the present invention as herein described may be made, and that features and elements of one embodiment may be selectively combined with features and elements of another, all without departing from the scope thereof as defined by the claims which follow.

What is claimed is:

1. A method for singulating at least one semiconductor die from a semiconductor wafer, the method comprising:
providing a semiconductor wafer having a body including an active surface and an opposing, bottom surface;
forming at least one trench in the semiconductor wafer body from the bottom surface thereof in alignment with a plurality of streets on the active surface circumscribing a location of at least one semiconductor die; and
cutting from the active surface of the semiconductor wafer body through the semiconductor wafer body with at least one laser beam along the plurality of streets between the active surface of the semiconductor wafer body and the at least one trench.

2. The method of claim 1, where forming at least one trench in the semiconductor wafer body comprises etching the at least one trench.

3. The method of claim 2, wherein etching the at least one trench comprises performing a wet etch or a dry etch.

4. The method of claim 2, wherein etching the at least one trench comprises performing an anisotropic etch or an isotropic etch.

5. The method of claim 2, further comprising reducing a thickness of the semiconductor wafer body prior to etching the at least one trench.

6. The method of claim 5, wherein reducing a thickness of the semiconductor wafer body comprises at least one of backgrinding and performing an etch back of the semiconductor wafer body.

7. The method of claim 2, wherein etching the at least one trench in the semiconductor wafer body comprises etching the at least one trench to a depth of about 60% to about 90% of a thickness of the semiconductor wafer body.

8. The method of claim 1, further comprising forming the at least one trench to a width greater than a beam width of the at least one laser beam.

9. The method of claim 1, wherein forming at least one trench in the semiconductor wafer body comprises cutting the at least one trench with at least another laser beam.

10. The method of claim 9, further comprising reducing a thickness of the semiconductor wafer body prior to cutting the at least one trench.

11. The method of claim 10, wherein reducing a thickness of the semiconductor wafer body comprises at least one of backgrinding and performing an etch back of the semiconductor wafer body.

12. The method of claim 9, wherein cutting the at least one trench in the semiconductor wafer body comprises cutting the at least one trench to a depth of about 60% to about 90% of a thickness of the semiconductor wafer body.

13. The method of claim 9, further comprising traversing the at least another laser beam to impinge the semiconductor wafer body along a path and substantially concurrently traversing the at least one laser beam to impinge the semiconductor wafer body along the same path subsequent to impingement of the at least another laser beam.

14. The method of claim 9, wherein cutting the at least one trench in the semiconductor wafer body with at least another laser beam comprises substantially concurrently cutting a plurality of laterally adjacent trenches in the semiconductor wafer body with a plurality of laser beams in a single pass across the semiconductor wafer.

15. The method of claim 14, wherein cutting a plurality of laterally adjacent trenches in the semiconductor wafer body with a plurality of laser beams comprises cutting a plurality of substantially parallel trenches using a plurality of lasers disposed in a row perpendicular to a direction of relative travel between the plurality of lasers and the semiconductor wafer.

16. The method of claim 15, further comprising cutting a second plurality of substantially parallel trenches using the plurality of lasers after rotationally reorienting either the semiconductor wafer or the row of lasers perpendicular to the direction of relative travel.

17. The method of claim 1, wherein cutting through the semiconductor wafer body with at least one laser beam along the plurality of streets between the active surface of the semiconductor wafer body and the at least one trench comprises cutting from the bottom surface of the semiconductor wafer body along the at least one trench.

18. The method of claim 1, wherein cutting through the semiconductor wafer body with at least one laser beam along the plurality of streets between the active surface of the semiconductor wafer body and the at least one trench comprises cutting a path having a width of less than 80 µm.

19. The method of claim 18, wherein cutting a path having a width of less than 80 µm comprises cutting a path having a width of about 1 µm.

20. The method of claim 1, wherein cutting through the semiconductor wafer body with at least one laser beam along the plurality of streets between the active surface of the semiconductor wafer and the at least one trench comprises cutting along at least some of the plurality of streets with a plurality of laser beams in a single pass across the semiconductor wafer.

21. The method of claim 20, wherein cutting along at least some of the plurality of streets with a plurality of laser beams in a single pass across the semiconductor wafer comprises cutting with a plurality of lasers disposed in a row perpendicular to a direction of relative travel between the plurality of lasers and the semiconductor wafer.

22. The method of claim 21, further comprising cutting along at least some other of the plurality of streets using the plurality of lasers after rotationally reorienting either the semiconductor wafer or the row of lasers perpendicular to the direction of relative travel.

23. The method of claim 1, wherein forming the at least one trench comprises forming a plurality of trenches respectively circumscribing locations of a plurality of semiconductor dice.

24. A method for singulating at least one semiconductor die from a semiconductor wafer, the method comprising:
providing a semiconductor wafer having a body including an active surface and an opposing, bottom surface;
cutting at least one trench in the semiconductor wafer body from the bottom surface thereof in alignment with a plurality of streets on the active surface circumscribing a location of at least one semiconductor die with at least one laser beam;
cutting through the semiconductor wafer body with at least another laser beam along the plurality of streets between the active surface of the semiconductor wafer body and the at least one trench; and
traversing the at least one laser beam to impinge the semiconductor wafer body along a path and substantially concurrently traversing the at least another laser beam to impinge the semiconductor wafer body along the same path subsequent to impingement of the at least one laser beam.

25. The method of claim 24, further comprising reducing a thickness of the semiconductor wafer body prior to cutting the at least one trench.

26. The method of claim 25, wherein reducing a thickness of the semiconductor wafer body comprises at least one of backgrinding and performing an etch back of the semiconductor wafer body.

27. The method of claim 26, wherein cutting the at least one trench in the semiconductor wafer body comprises cutting the at least one trench to a depth of about 60% to about 90% of a thickness of the semiconductor wafer body.

28. A method for singulating at least one semiconductor die from a semiconductor wafer, the method comprising:
providing a semiconductor wafer having a body including an active surface and an opposing, bottom surface;
cutting substantially concurrently in a single pass across the semiconductor wafer a plurality of substantially parallel, laterally adjacent trenches in the semiconductor wafer body from the bottom surface thereof in alignment with a plurality of streets on the active surface circumscribing a location of at least one semiconductor die with a plurality of laser beams disposed in a row perpendicular to a direction of relative travel between the plurality of lasers and the semiconductor wafer;
cutting a second plurality of substantially parallel trenches using the plurality of lasers after rotationally reorienting either the semiconductor wafer or the row of lasers perpendicular to the direction of relative travel; and
cutting through the semiconductor wafer body with at least another laser beam along the plurality of streets between the active surface of the semiconductor wafer body and the at least one trench.

29. The method of claim 28, further comprising reducing a thickness of the semiconductor wafer body prior to cutting the plurality of substantially parallel, laterally adjacent trenches.

30. The method of claim 29, wherein reducing a thickness of the semiconductor wafer body comprises at least one of backgrinding and performing an etch back of the semiconductor wafer body.

31. The method of claim 30, wherein cutting the plurality of substantially parallel, laterally adjacent trenches in the semiconductor wafer body comprises cutting at least one trench of the plurality of substantially parallel, laterally adjacent trenches to a depth of about 60% to about 90% of a thickness of the semiconductor wafer body.

32. A method for singulating at least one semiconductor die from a semiconductor wafer, the method comprising:
providing a semiconductor wafer having a body including an active surface and an opposing, bottom surface;
forming at least one trench in the semiconductor wafer body from the bottom surface thereof in alignment with a plurality of streets on the active surface circumscribing a location of at least one semiconductor die; and
cutting through the semiconductor wafer body with at least a plurality of lasers disposed in a row perpendicular to a direction of relative travel between the plurality of lasers and the semiconductor wafer along at least some of the plurality of streets between the active surface of the semiconductor wafer body and the at least one trench in a single pass across the semiconductor wafer; and
cutting along at least some other of the plurality of streets using the plurality of lasers after rotationally reorienting either the semiconductor wafer or the row of lasers perpendicular to the direction of relative travel.

* * * * *

UNITED STATES PATENT AND TRADEMARK OFFICE
CERTIFICATE OF CORRECTION

PATENT NO. : 7,129,114 B2
APPLICATION NO. : 10/797504
DATED : October 31, 2006
INVENTOR(S) : Salman Akram It is certified that error appears in the above-identified patent and that said Letters Patent is hereby corrected as shown below:

In the specification:

| | | |
|---|---|---|
| COLUMN 2, | LINE 28, | change "by of the top" --by reference, discloses an attempt to combine this technique with laser cutting by making a shallow cut of the top-- |
| COLUMN 2, | LINE 36, | change "No. 136,668" to --No. 6,136,668-- |
| COLUMN 3, | LINE 26, | change "perimeter" to --perimeters-- |
| COLUMN 9, | LINE 38, | change "maybe formed" to --may be formed-- |
| COLUMN 9, | LINE 45, | change "maybe formed" to --may be formed-- |
| COLUMN 10, | LINE 22, | change "state form" to --state to form-- |

Signed and Sealed this

Thirtieth Day of October, 2007

JON W. DUDAS
*Director of the United States Patent and Trademark Office*